(12) United States Patent
Aburatani et al.

(10) Patent No.: US 11,521,848 B2
(45) Date of Patent: Dec. 6, 2022

(54) METHOD OF MANUFACTURING SEMICONDUCTOR DEVICE, SUBSTRATE PROCESSING APPARATUS, AND RECORDING MEDIUM

(71) Applicant: Kokusai Electric Corporation, Tokyo (JP)

(72) Inventors: Yukinori Aburatani, Toyama (JP); Naofumi Ohashi, Toyama (JP); Tetsuo Yamamoto, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/479,554

(22) Filed: Sep. 20, 2021

(65) Prior Publication Data
US 2022/0301864 A1 Sep. 22, 2022

(30) Foreign Application Priority Data
Mar. 18, 2021 (JP) .............................. JP2021-045271

(51) Int. Cl.
 *H01L 21/683* (2006.01)
 *H01L 21/02* (2006.01)
 *H01L 21/67* (2006.01)
(52) U.S. Cl.
 CPC .. *H01L 21/02255* (2013.01); *H01L 21/67098* (2013.01); *H01L 21/6838* (2013.01)
(58) Field of Classification Search
 CPC ...................... H01L 21/02255; H01L 21/6838
 See application file for complete search history.

(56) References Cited

U.S. PATENT DOCUMENTS

| | | |
|---|---|---|
| 2016/0322213 A1 | 11/2016 | Thompson et al. |
| 2018/0053659 A1 | 2/2018 | Chakraborty et al. |
| 2018/0211833 A1 | 7/2018 | Li et al. |
| 2020/0006057 A1 | 1/2020 | Azumo |
| 2020/0105515 A1* | 4/2020 | Maes ................ H01L 21/02669 |
| 2020/0303185 A1 | 9/2020 | Nakagawa et al. |
| 2021/0098258 A1 | 4/2021 | Degai et al. |

FOREIGN PATENT DOCUMENTS

| | | |
|---|---|---|
| JP | 10-256404 A | 9/1998 |
| JP | 2013-243193 A | 12/2013 |
| JP | 2018-512504 A | 5/2018 |

(Continued)

OTHER PUBLICATIONS

Japanese Office Action dated Sep. 20, 2022 for Japanese Patent Application No. 2021-045271.

*Primary Examiner* — Mohammad M Choudhry
(74) *Attorney, Agent, or Firm* — Volpe Koenig

(57) ABSTRACT

There is provided technique that includes (a) adsorbing a first adsorption inhibitor to a first portion of a substrate in a first process chamber by heating the substrate to a first temperature and supplying the first adsorption inhibitor; (b) after (a), forming a film on a second portion of the substrate, where the first adsorption inhibitor is not adsorbed, by heating the substrate to a second temperature higher than the first temperature and supplying a processing gas; and (c) after (b), removing the first adsorption inhibitor adsorbed to the substrate by heating the substrate to a third temperature higher than the second temperature.

17 Claims, 12 Drawing Sheets

(56) References Cited

FOREIGN PATENT DOCUMENTS

| JP | 2018-523289 A | 8/2018 |
| JP | 2020-002452 A | 1/2020 |
| JP | 2020-515082 A | 5/2020 |
| JP | 2020-155607 A | 9/2020 |
| WO | 2019/229785 A1 | 12/2019 |

* cited by examiner

METHOD OF MANUFACTURING SEMICONDUCTOR DEVICE, SUBSTRATE PROCESSING APPARATUS, AND RECORDING MEDIUM

CROSS-REFERENCE TO RELATED APPLICATIONS

This application is based upon and claims the benefit of priority from Japanese Patent Application No. 2021-045271, filed on Mar. 18, 2021, the entire contents of which are incorporated herein by reference.

TECHNICAL FIELD

The present disclosure relates to a method of manufacturing a semiconductor device, a substrate processing apparatus, and a recording medium.

BACKGROUND

As one of processes of manufacturing a semiconductor device, a process of selectively growing and forming a film on the surface of a specific base among a plurality of types of bases exposed on the surface of a substrate may be performed. The ability to selectively grow and form a film will be hereinafter appropriately referred to as "selectivity".

SUMMARY

Some embodiments of the present disclosure provide a method of manufacturing a semiconductor device, a substrate processing apparatus, and a recording medium, which are capable of maintaining selectivity.

According to one embodiment of the present disclosure, there is provided technique that includes supplying an adsorption inhibitor to adsorb the adsorption inhibitor to a first portion of a substrate in a process chamber by heating the substrate to a first temperature and supplying the adsorption inhibitor; supplying a processing gas after the act of supplying the adsorption inhibitor to form a film on a second portion of the substrate where the adsorption inhibitor is not adsorbed by heating the substrate to a second temperature higher than the first temperature and supplying a processing gas; and removing the adsorption inhibitor after the act of supplying the processing gas to remove the adsorption inhibitor adsorbed to the substrate by heating the substrate to a third temperature higher than the second temperature.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

(Substrate Processing Apparatus)

Figure 1:
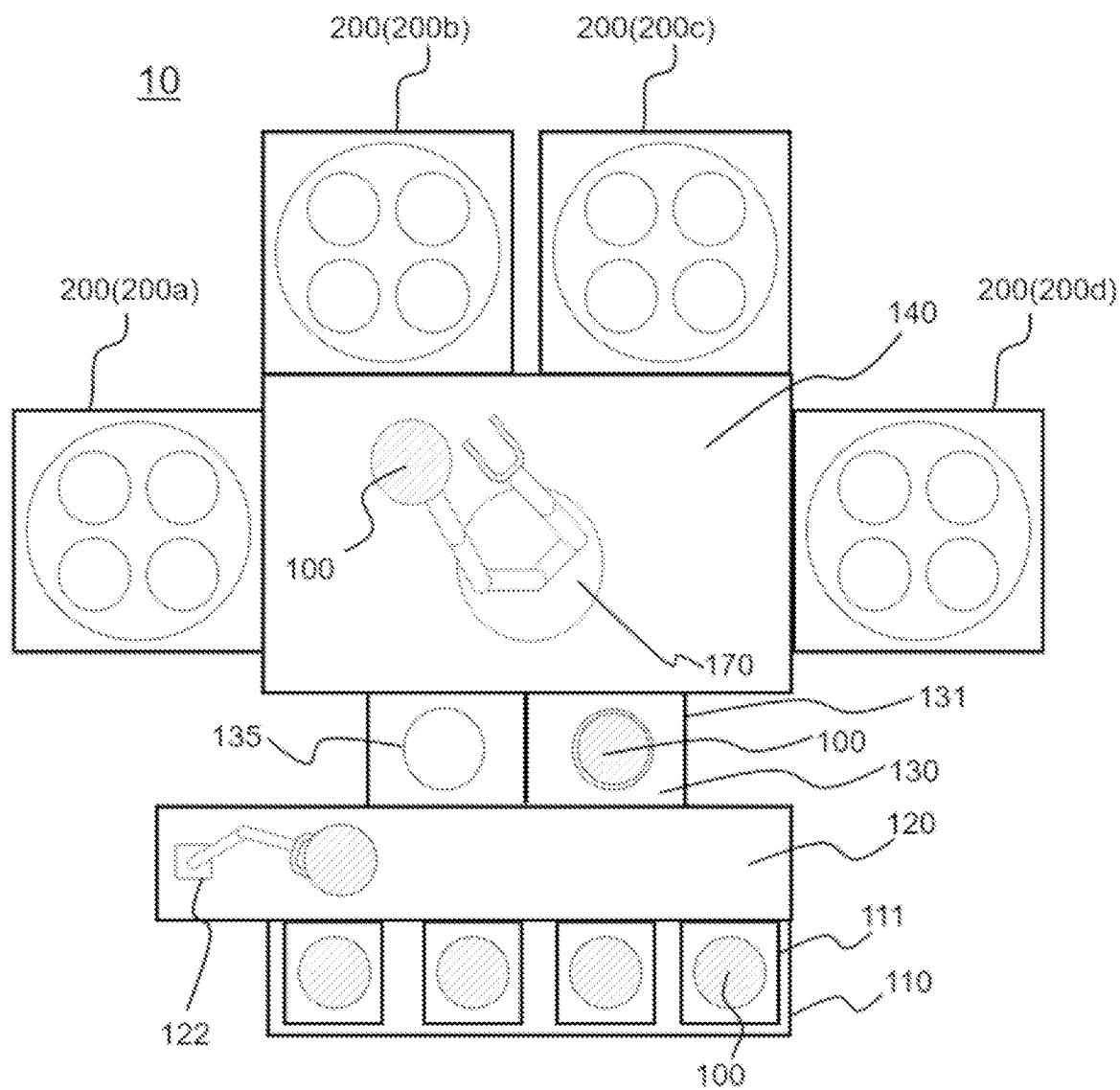
FIG. 1 is a plan view showing a schematic configuration of a substrate processing system according to an embodiment of the present disclosure.

A substrate processing system 10 and a method of manufacturing a semiconductor device according to an embodiment of the present disclosure will be described with reference to FIGS. 1 to 11. As shown in FIG. 1, the substrate processing system 10 to which the present disclosure is applied is an apparatus that processes a product wafer 100 as a substrate, and mainly includes an IO stage 110, an atmospheric transfer chamber 120, a load lock chamber 130, a vacuum transfer chamber 140, and a plurality of substrate processing apparatuses 200 (in the present embodiment, for example, 200a to 200d). The wafer 100 is, for example, a product wafer on which a circuit and the like have already been formed.

(Atmospheric Transfer Chamber/IO Stage)

The IO stage (load port) 110 is installed in front of the substrate processing system 10. A pod 111 is mounted on the IO stage 110. The pod 111 is used as a carrier for transporting a wafer 100 such as a silicon (Si) substrate or the like. A support portion (not shown) for supporting a plurality of wafers 100 in multiple stages and in horizontal posture, is provided in the pod 111.

The IO stage 110 is adjacent to the atmospheric transfer chamber 120. The load lock chamber 130, which will be described later, is connected to a surface of the atmospheric transfer chamber 120, which is different from a surface for the IO stage 110. An atmospheric transfer robot 122 for transferring the wafer 100 is installed in the atmospheric transfer chamber 120. The atmospheric transfer robot 122 transfers the wafer 100 between the load lock chamber 130 and the pod 111.

(Load Lock Chamber)

The load lock chamber 130 is adjacent to the atmospheric transfer chamber 120. The vacuum transfer chamber 140, which will be described later, is arranged on one of surfaces of a housing 131 that constitutes the load lock chamber 130, which different from another surface for the atmospheric transfer chamber 120.

The load lock chamber 130 includes at least two mounting surfaces 135 on which the wafers 100 are mounted. For example, one mounting surface 135 is configured to mount a processed wafer 100 thereon, and the other mounting surface 135 is configured to mount an unprocessed wafer 100 thereon.

(Vacuum Transfer Chamber)

The substrate processing system 10 includes a vacuum transfer chamber (transfer module) 140 as a transfer chamber that serves as a transfer space in which the wafer 100 is transferred under a negative pressure. The load lock chamber 130 and the substrate processing apparatuses 200 (200a to 200d) for processing the wafer 100 are connected to the vacuum transfer chamber 140. A vacuum transfer robot 170 as a transfer part for transferring (conveying) the wafer 100 under a negative pressure is installed at a substantially central portion of the vacuum transfer chamber 140.

The vacuum transfer robot 170 is configured to be raised or lowered by means of an elevator and a flange while maintaining the airtightness of the vacuum transfer chamber 140. The arm of the vacuum transfer robot 170 is capable of extending and rotating around an axis. By performing rotation and extension, the vacuum transfer robot 170 transfers the wafer 100 into and out of the substrate processing apparatus 200. In addition, the vacuum transfer robot 170 can transfer the wafer 100 to the substrate processing apparatus 200 according to the instruction of a controller 280 described later.

(Substrate Processing Apparatus)

In the substrate processing system 10 of the present embodiment, for example, a plurality of substrate processing apparatuses 200 (e.g., four substrate processing apparatuses 200a to 200d) is installed.

Subsequently, the substrate processing apparatus 200 used in a sacrificial film forming step S104 will be described.

(Process Container)

Figure 2:
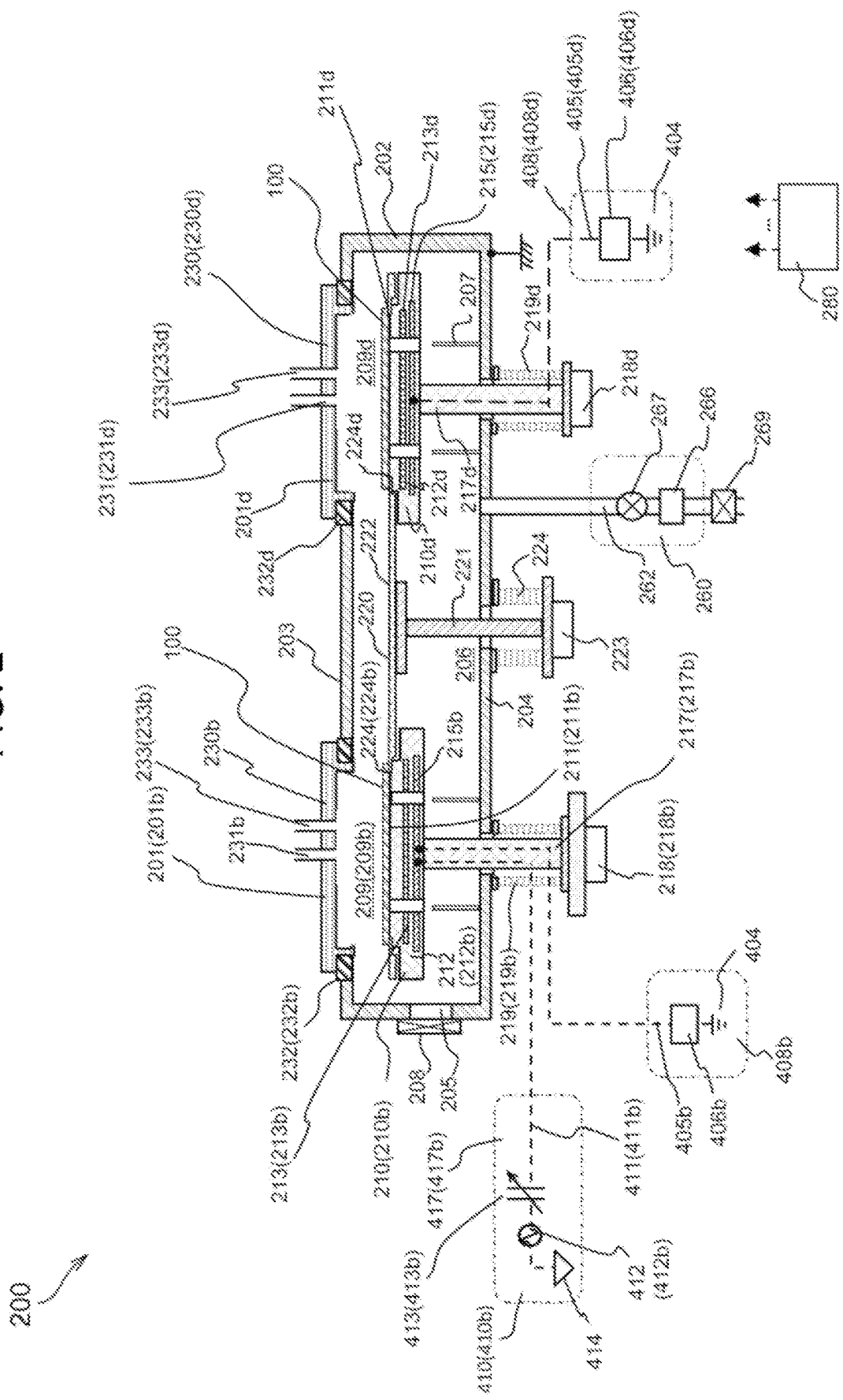
FIG. 2 is a vertical sectional view showing a container of the substrate processing system according to an embodiment of the present disclosure.

As shown in FIG. 2, the substrate processing apparatus 200 includes a container 202. The container 202 is also called a processing module. The container 202 is configured as, for example, a closed container having an angular cross section and a flat shape. Further, the container 202 is made of a metal material such as aluminum (Al) or stainless steel (SUS). In the container 202, there are formed a process chamber 201 for processing a wafer 100 such as a silicon wafer or the like and a transfer chamber 206 through which a wafer 100 passes when the wafer 100 is transferred to the process chamber 201. The process chamber 201 includes a shower head 230, a substrate mount 210, and the like, which will be described later. Further, the transfer chamber 206 includes a rotary tray 222 and a bottom portion 204 of the process container 202.

A substrate loading/unloading port 205 adjacent to a gate valve 208 is installed on the side surface of the container 202. The wafer 100 is moved between the container 202 and the vacuum transfer chamber 140 (not shown) via the substrate loading/unloading port 205. A plurality of lift pins 207 is installed on the bottom portion 204.

Figure 3:
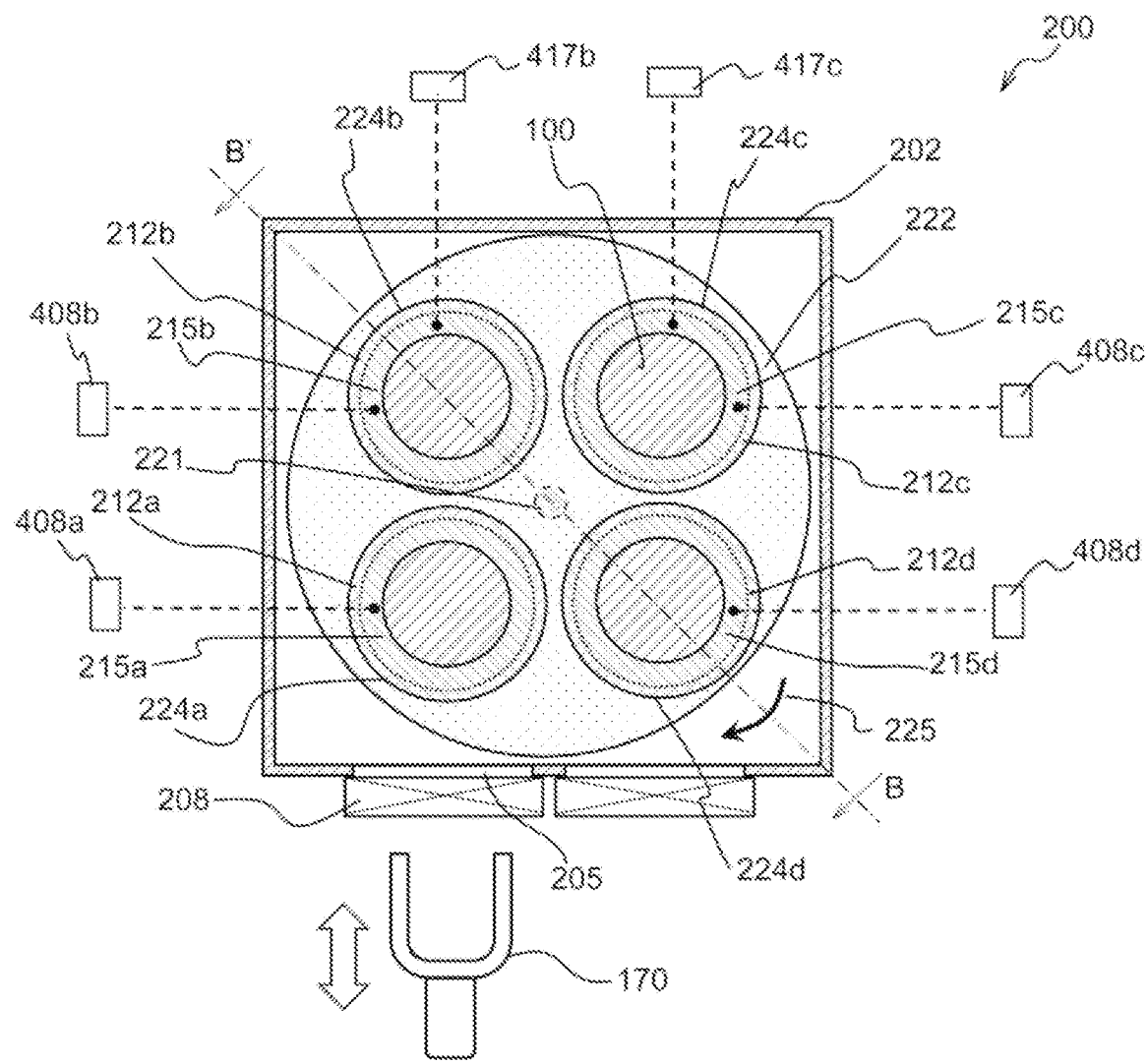
FIG. 3 is a partially-sectional plan view showing the container of the substrate processing system according to an embodiment of the present disclosure.

In the process chamber 201, the substrate mount 210 that supports the wafer 100 is arranged. There is installed a plurality of substrate mounts 210. The arrangement of the plurality of substrate mounts 210 is with reference to FIG. 3. FIG. 3 is a view showing the substrate processing apparatus 200, particularly the vicinity of the rotary tray 222 as viewed from above. The arm of the vacuum transfer robot 170 is arranged outside the container 202 and has a function of transferring the wafer 100 into and out of the container 202. The vertical sectional view taken along line B-B' in FIG. 3 corresponds to FIG. 2.

Four substrate mounting tables 212, which are one configuration of the substrate mounts 210, are installed. Specifically, the substrate mounting table 212a, the substrate mounting table 212b, the substrate mounting table 212c and the substrate mounting table 212d are arranged clockwise from the position facing the substrate loading/unloading port 205. The wafer 100 loaded into the container 202 is mounted on the substrate mounting table 212a, the substrate mounting table 212b, the substrate mounting table 212c or the substrate mounting table 212d by rotating the rotary tray 222. The substrate mounting tables are also called susceptors.

As shown in FIG. 2, the substrate mounts 210 mainly include substrate mounting surfaces 211 (substrate mounting surface 211a to substrate mounting surface 211d) on which the wafers 100 are mounted, respectively; substrate mounting tables 212 (substrate mounting table 212a to substrate mounting table 212d) having the substrate mounting surfaces 211 on their surfaces; bias electrodes 215 (bias electrode 215a to bias electrode 215d); and shafts 217 (shaft 217a to shaft 217b) supporting the substrate mounting tables 212. Further, the substrate mounts 210 include heaters 213 (213a to 213d) as heating devices. In the substrate mounting tables 212, through-holes through which the lift pins 207 penetrate are installed at the positions corresponding to the lift pins 207.

The substrate mounting tables 212 (substrate mounting table 212a to 212d) are supported by shafts 217 (shaft 217a to 217d), respectively. The shafts 217 penetrate the bottom portions 204 of the containers 202, and are connected to corresponding elevators 218 (elevator 218a to 218d), respectively, outside the containers 202. The shafts 217 are insulated from the containers 202.

The elevators 218 can elevate the shafts 217 and the substrate mounting tables 212. The peripheries of lower end portions of the respective shafts 217 are covered with bellows 219 (bellows 219a to 219d), respectively, whereby the inside of the containers 202 is kept airtight. When transferring the wafer 100, the substrate mounting table 212 is lowered so that the substrate mounting surface 211 and the rotary tray 222 are positioned so as to face the substrate loading/unloading port 205. When processing the wafer 100, as shown in FIG. 2, the substrate mounting table 212 is raised until the wafer 100 reaches a processing position in the processing space 209.

Figure 4:
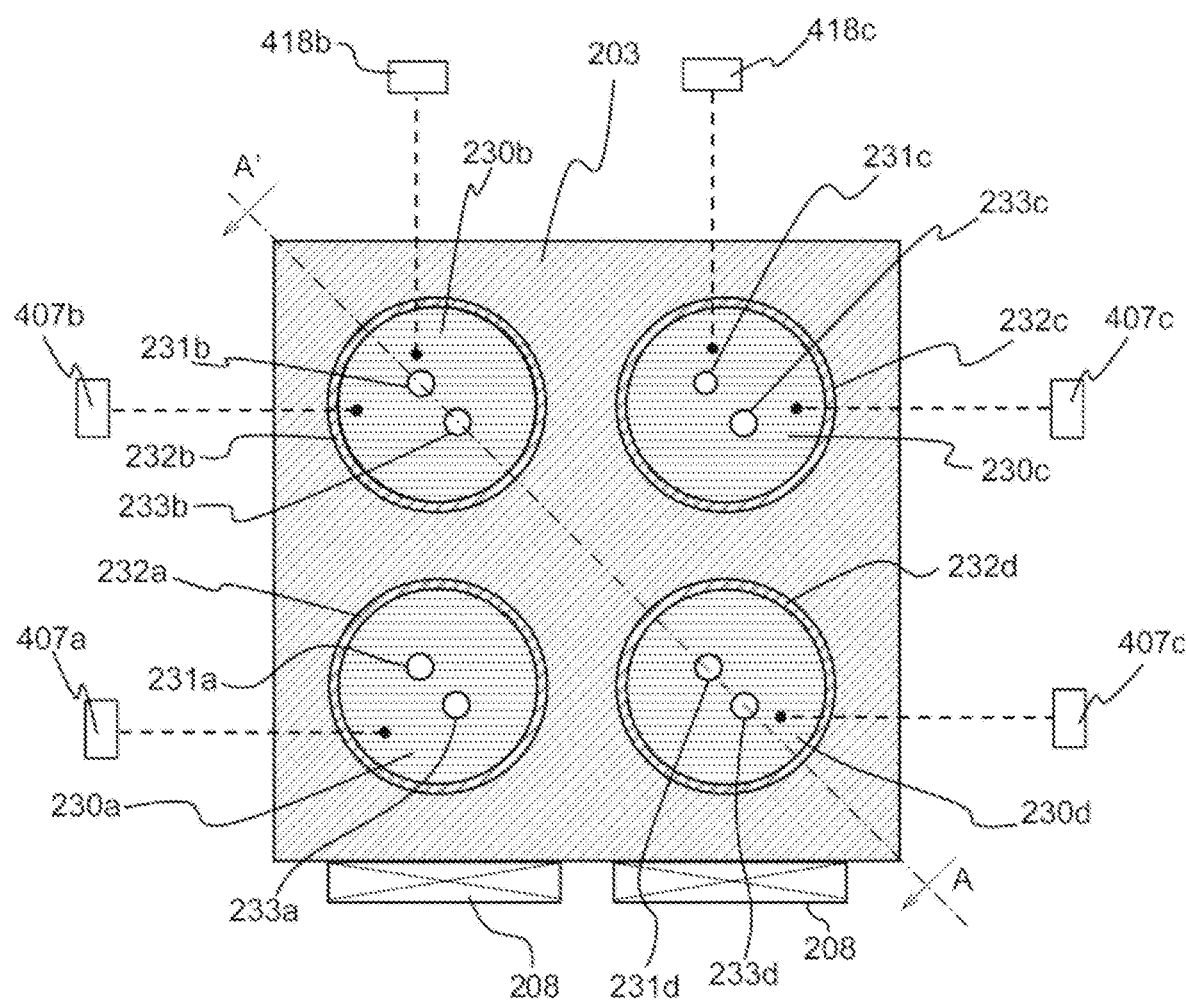
FIG. 4 is a plan view showing the container of the substrate processing system according to an embodiment of the present disclosure.

Shower heads 230 (230a to 230d) as gas dispersion mechanisms are installed on the lids 203 of the containers 202 at the positions facing the respective substrate mounting surfaces 211. When viewed from above, as shown in FIG. 4, a plurality of shower heads 230 is arranged. The shower heads 230 are supported by the lids 203 via insulating rings 232 (232a to 232d). The shower heads 230 and the containers 202 are insulated by the insulating rings 232. The respective lids of the shower heads 230 (230a to 230d) are installed with gas introduction holes 231 (231a to 231d). The respective gas introduction holes 231 communicate with a common gas supply pipe 301, which will be described later. The vertical sectional view taken along line A-A' in FIG. 4 corresponds to FIG. 2.

As shown in FIG. 2, the space between each shower head 230 and each substrate mounting surface 211 is referred to as processing space 209. In the present embodiment, the space between the shower head 230a and the substrate mounting surface 211a is referred to as processing space 209a. The space between the shower head 230b and the substrate mounting surface 211b is referred to as processing space 209b. The space between the shower head 230c and the substrate mounting surface 211c is referred to as processing space 209c. The space between the shower head 230d and the substrate mounting surface 211d is referred to as processing space 209d.

Further, the structure that constitutes the processing space 209 is referred to as process chamber 201. In the present embodiment, the structure that constitutes the processing space 209a and includes at least the shower head 230a and the substrate mounting surface 211a is referred to as process chamber 201a. The structure that constitutes the processing space 209b and includes at least the shower head 230b and the substrate mounting surface 211b is referred to as process chamber 201b. The structure that constitutes the processing space 209c and includes at least the shower head 230c and the substrate mounting surface 211c is referred to as process chamber 201c. The structure that constitutes the processing space 209d and includes at least the shower head 230d and the substrate mounting surface 211d is referred to as process chamber 201d.

Although it is described here that the process chamber 201 includes at least the shower head 230a and the substrate mounting surface 211a, the process chamber 201 may be any structure that constitutes the processing space 209 for processing the wafer 100. It goes without saying that depending on the apparatus structure, the structure of the shower head 230 and the like may be changed.

As shown in FIGS. 2 and 3, the respective substrate mounts 210 are arranged around a shaft 221 of a substrate rotating part 220. A rotary tray 222 is installed on the shaft 221. Further, the shaft 221 is configured to penetrate the bottom portion 204 of the container 202, and a rotating elevator 223 is installed outside the container 202 on a different side from the rotary tray 222. The rotating elevator 223 raises or lowers and rotates the shaft 221. The substrate mounts 210 can be independently raised and lowered by the rotating elevator 223. A bellows 219 is installed around the lower end of the shaft 221 outside the container 202. The rotation direction of the rotating elevator 223 is, for example, the direction of arrow 225 in FIG. 3 (clockwise direction). The shaft 221, the rotary tray 222 and the rotating elevator 223 are collectively referred to as substrate rotating part 220. The substrate rotating part 220 is also referred to as substrate transfer part.

The rotary tray 222 is configured, for example, as a circular shape. At the outer peripheral end of the rotary tray 222, the holes 224 (224a to 224d) having at least the same diameter as the substrate mounting surface 211 are installed in the same number of the substrate mounts 210. Further, the rotary tray 222 includes a plurality of claws (not shown) protruding inward of the holes 224. The claws are configured to support the back surface of the wafer 100. In the present embodiment, the wafer 100 being mounted in the hole 224 indicates that the wafer 100 is mounted on the claws.

By raising the shaft 221, the rotary tray 222 is positioned at a position higher than the substrate mounting surface 211. At this time, the wafer 100 mounted on the substrate mounting surface 211 is picked up by the claws. Further, by rotating the shaft 221, the rotary tray 222 is rotated, and the picked-up wafer 100 is moved onto the next substrate mounting surface 211. For example, the wafer 100 mounted on the substrate mounting surface 211b is moved onto the substrate mounting surface 211c. Thereafter, the shaft 221 is lowered to lower the rotary tray 222. In this operation, the rotary tray 222 is lowered until the hole 224 is located below the substrate mounting surface 211, and the wafer 100 is mounted on the substrate mounting surface 211.

(Exhaust System)

Next, the exhaust system 260 that exhausts the atmosphere in the container 202 will be described with reference to FIG. 2. An exhaust pipe 262 is connected to the container 202 so as to communicate with the process chamber 201. The exhaust pipe 262 is installed with an APC (Auto Pressure Controller) 266, which is a pressure controller that controls the pressure in the process chamber 201 to a predetermined pressure. The APC 266 includes a valve body (not shown) whose opening degree can be adjusted, and adjusts the conductance of the exhaust pipe 262 in response to an instruction from the controller 280. Further, a valve 267 is installed on the upstream side of the APC 266 in the exhaust pipe 262. The exhaust pipe 262, the valve 267 and the APC 266 are collectively referred to as exhaust system 260.

The exhaust system 260 is further installed with a DP (Dry Pump) 269. The DP 269 exhausts the atmosphere in the process chamber 201 through the exhaust pipe 262.

(Gas Supply Part) (Processing Gas Supply Part)

Subsequently, the processing gas supply part 300 will be described with reference to FIG. 5. Here, the processing gas supply part 300 connected to the respective gas introduction holes 231 is described. In addition, a gas supply part refers to the processing gas supply part 300 only, or is implemented together with the processing gas supply part 300. The processing gas supply part 300 is also referred to as processing gas supply device (or supplier) 300, or processing gas supply line 300.

Figure 5:
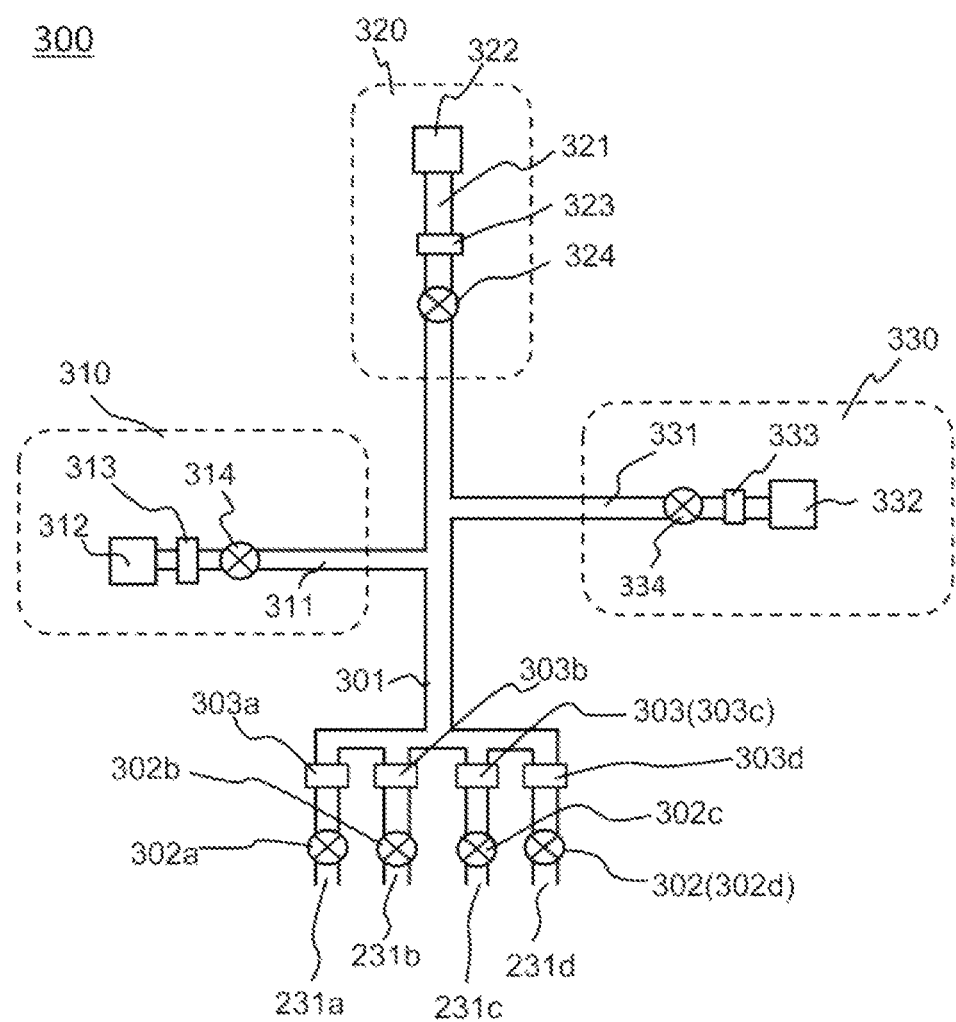
FIG. 5 is a piping diagram showing a piping system of the substrate processing system according to an embodiment of the present disclosure.

As shown in FIGS. 4 and 5, the shower head 230 is connected to the common gas supply pipe 301 via the valves 302 (302a to 302d) and the mass flow controllers 303 (303a to 303d) so that the gas introduction holes 231 communicate with the common gas supply pipe 301. The amount of the gas supplied to the respective process chambers is adjusted by using the valves 302 (302a to 302d) and the mass flow controllers 303 (303a to 303d). The first gas supply pipe 311, the second gas supply pipe 321 and the third gas supply pipe 331 are connected to the common gas supply pipe 301.

(First Gas Supply System)

On the first gas supply pipe 311, a first gas source 312, a mass flow controller (MFC) 313, which is a flow rate controller (flow rate control part), and a valve 314, which is an opening/closing valve, are installed sequentially from the upstream side.

The first gas source 312 is a source of a first gas containing a first element (also referred to as "first-element-containing gas"). The first-element-containing gas is one of precursor gases, i.e., processing gases. Here, the first element is silicon (Si). That is, the first-element-containing gas is a silicon-containing gas. Specifically, a dichlorosilane ($SiH_2Cl_2$, also referred to as DCS) gas or a hexachlorodisilane ($Si_2Cl_6$, also referred to as HCDS) gas is used as the silicon-containing gas.

A first gas supply system 310 (also referred to as silicon-containing gas supply system) is mainly constituted by the first gas supply pipe 311, the mass flow controller 313 and the valve 314.

(Second Gas Supply System)

On the second gas supply pipe 321, a second gas source 322, a mass flow controller (MFC) 323, which is a flow rate controller (flow rate control part), and a valve 324, which is an opening/closing valve, are installed sequentially from the upstream side.

The second gas source 322 is a source of a second gas containing a second element (hereinafter also referred to as "second-element-containing gas"). The second-element-containing gas is one of processing gases. The second-element-containing gas may be considered as a reaction gas.

Here, the second-element-containing gas contains a second element different from the first element. The second element is, for example, nitrogen (N). In the present embodiment, the second-element-containing gas is, for example, a nitrogen-containing gas. Specifically, an ammonia ($NH_3$) gas is used as the nitrogen-containing gas.

A second gas supply system 320 (also referred to as reaction gas supply system) is mainly constituted by the second gas supply pipe 321, the mass flow controller 323 and the valve 324.

(Third Gas Supply System)

On the third gas supply pipe 331, a third gas source 332, a mass flow controller (MFC) 333, which is a flow rate controller (flow rate control part), and a valve 334, which is an opening/closing valve, are installed sequentially from the upstream side.

The third gas source 332 is an inert gas source. The inert gas is, for example, a nitrogen ($N_2$) gas.

A third gas supply system 330 is mainly constituted by the third gas supply pipe 331, the mass flow controller 333 and the valve 334.

The inert gas supplied from the third gas source 332 acts as a purge gas for purging the gas remaining in the container 202 or the shower head 230, and acts as a cooling gas for cooling the wafer 100 in a substrate processing process.

(Fourth Gas Supply System)

Figure 6:
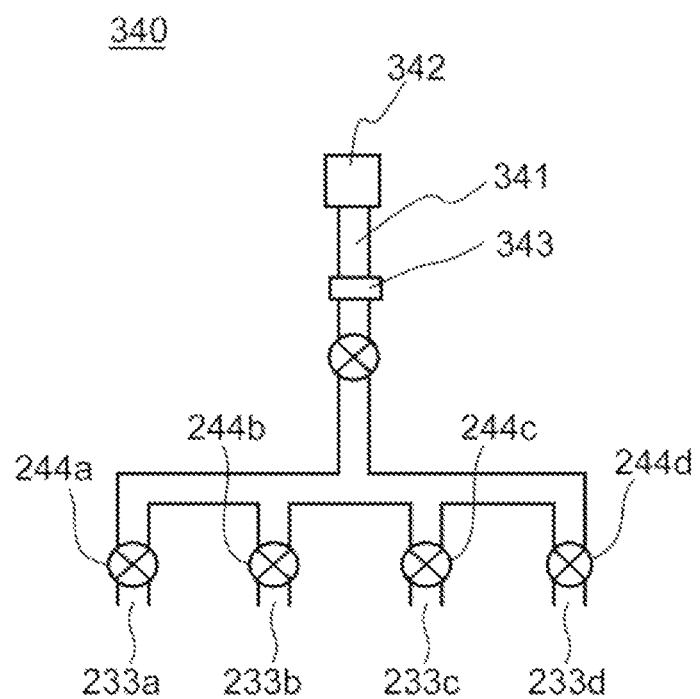
FIG. 6 is a schematic configuration diagram showing a piping system of the substrate processing system according to an embodiment of the present disclosure.

Subsequently, an adsorption inhibitor supply part 340 communicating with the gas introduction holes 233a to 233d will be described with reference to FIG. 6. The adsorption inhibitor supply part 340 is also referred to as adsorption inhibitor supply device (or supplier) 340, adsorption inhibitor supply line 340, or the like.

A fourth gas supply pipe 341 is connected to the shower head 230 so as to communicate with the gas introduction holes 233a to 233d.

On the fourth gas supply pipe 341, an adsorption inhibitor source 342, a mass flow controller 343 and a valve 344 (344b, 344c) are installed sequentially from the upstream side. As the adsorption inhibitor, for example, a $ClF_3$ gas is used. The gas supply pipe 341, the mass flow controller 343 and the valve 344 are collectively referred to as adsorption inhibitor supply part 340. The adsorption inhibitor supply part 340 may include the adsorption inhibitor source 342.

In addition, any one of the first gas supply system, the second gas supply system, the third gas supply system and the fourth gas supply system, or a combination thereof is referred to as processing gas supply part 300.

(Controller)

Figure 7:
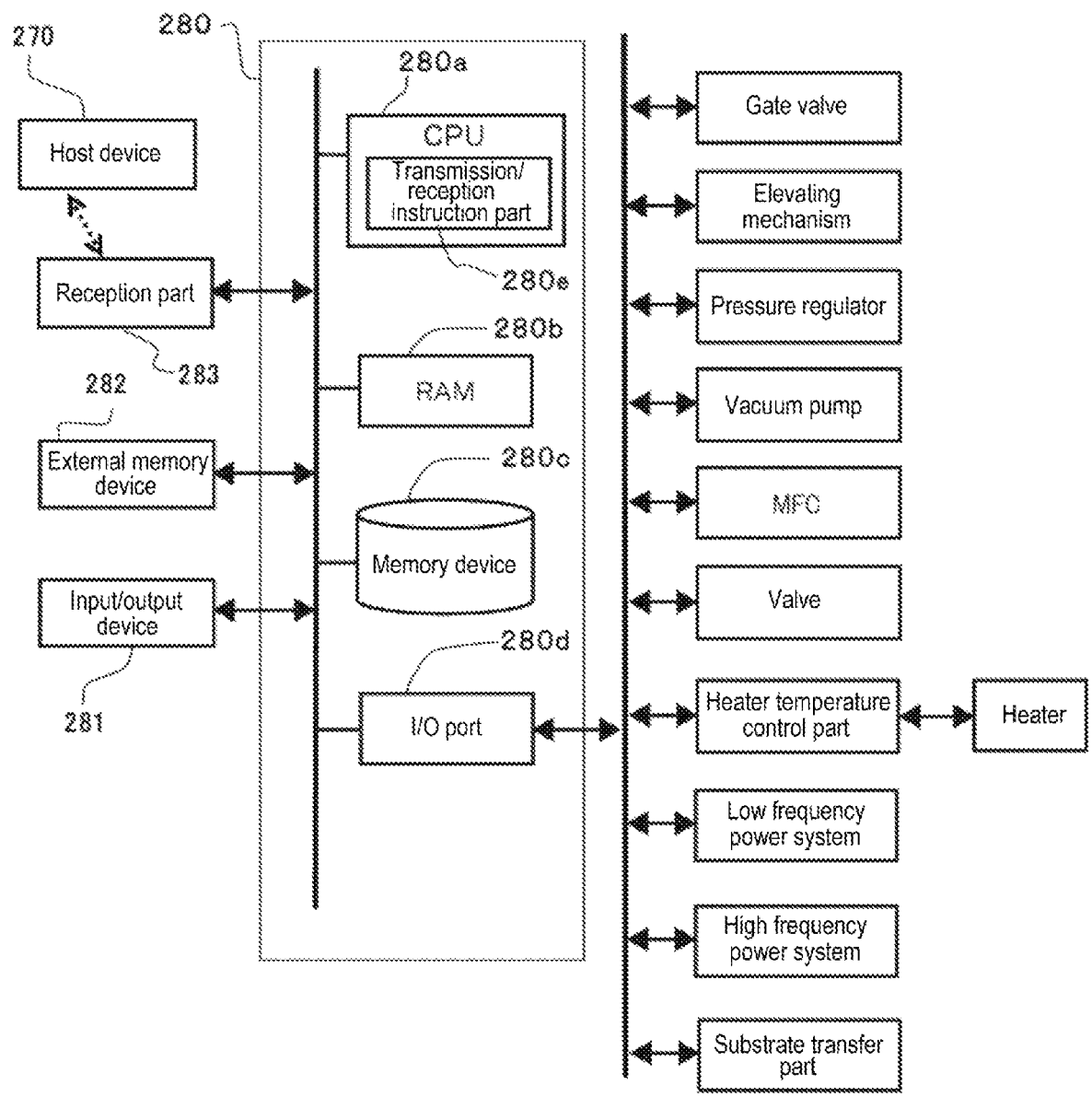
FIG. 7 is a schematic configuration diagram showing a controller of the substrate processing system according to an embodiment of the present disclosure.
Figure 8:
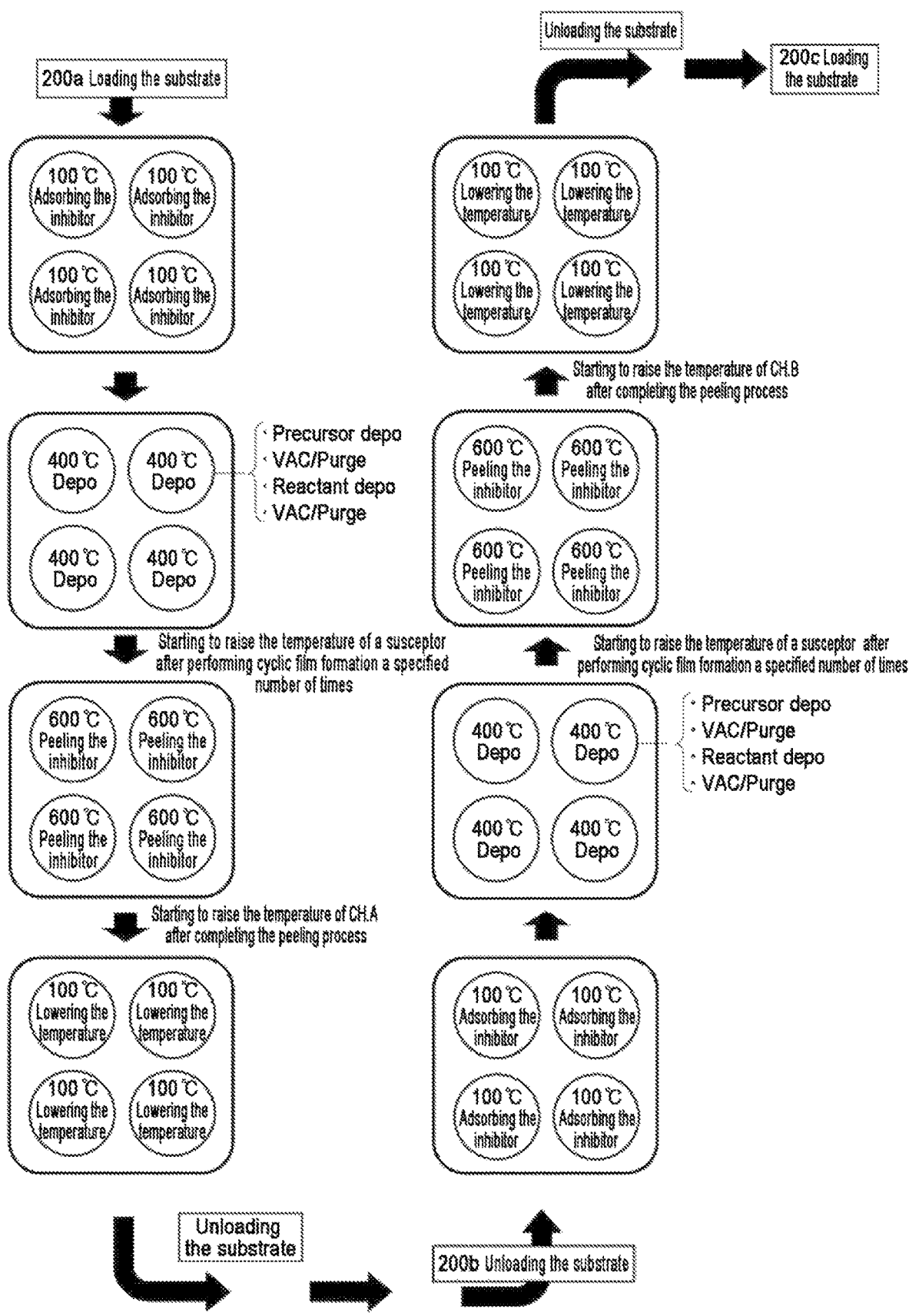
FIG. 8 is a diagram showing a wafer processing process according to an embodiment of the present disclosure.
Figure 9:
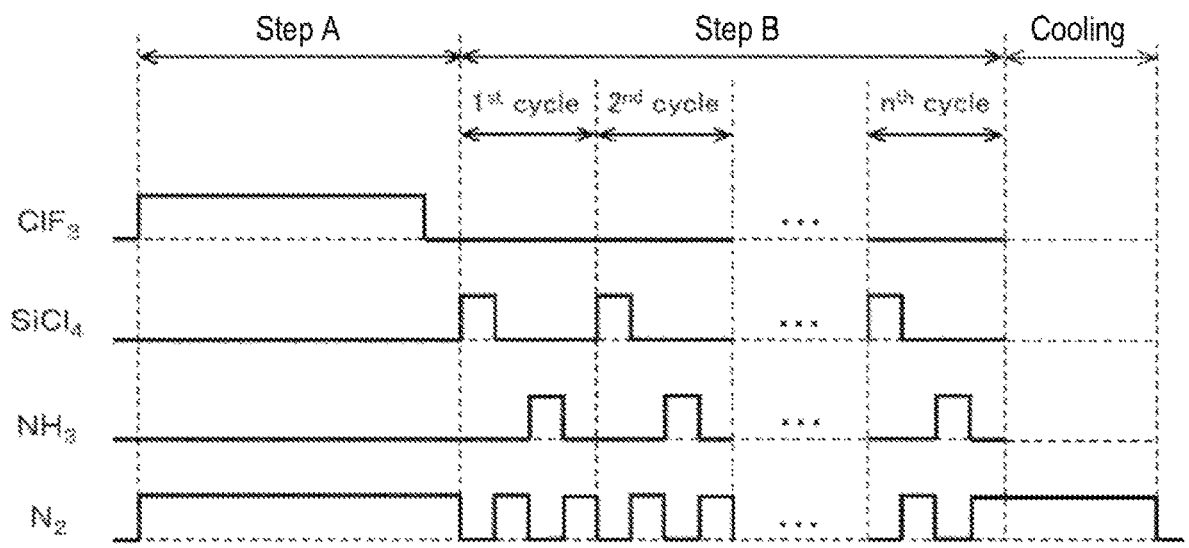
FIG. 9 is a diagram showing a part of a processing sequence in the selective growth of a film according to an embodiment of the present disclosure.

The substrate processing system 10 includes a controller 280 as a control device that controls the operation of each part of the substrate processing system 10. As shown in FIG. 7, the controller 280 includes at least a calculation part (CPU) 280a, a temporary memory device (RAM) 280b, a memory device 280c and an I/O port 280d. The controller 280 is connected to each component of the substrate processing system 10 via the I/O port 280d. The controller 280 calls a program or a recipe from the memory device 280c according to the instruction of the user, and controls the operation of each component according to the contents thereof. Transmission/reception control is performed, for example, by a transmission/reception instruction part 280e of the calculation part 280a. The controller 280 may be configured as a dedicated computer or a general-purpose computer. For example, the controller 280 according to the present embodiment may be configured by preparing an external memory device (e.g., a magnetic tape, a magnetic disk such as a flexible disk, a hard disk or the like, an optical disk such as a CD, a DVD or the like, a magneto-optical disk such as an MO or the like, or a semiconductor memory such as a USB memory (USB Flash Drive)), a memory card or the like) 282 that stores the above-mentioned program, and installing the program on a general-purpose computer through the use of the external memory device 282. Further, the means for supplying the program to the computer is not limited to the case of supplying the program via the external memory device 282. For example, a communication means such as the Internet or a dedicated line may be used, or information may be received from the controller 280 via the reception part 283 and the program may be supplied without going through the external memory device 282. In addition, the controller 280 may be instructed by using an input/output device 281 such as a keyboard or a touch panel.

The memory device 280c and the external memory device 282 are configured as a computer-readable recording medium. Hereinafter, these are collectively and simply referred to as recording medium. When the term "recording medium" is used herein, it may include only the memory device 280c, only the external memory device 282, or both.

(Substrate Processing Process)

As one of processes of manufacturing a semiconductor device through the use of the above-described substrate processing system 10, an example of a substrate processing process for selective film growth (selective film formation) in which a film is selectively grown and formed on the surface of a specific base among a plurality of types of bases exposed on the surface of the wafer 100 as a substrate will be described mainly with reference to FIGS. 8, 9, 10, 11 and 12A to 12D. In the following description, the operation of each part constituting the substrate processing system 10 is controlled by the controller 280.

(Wafer Loading Step: S201)

First, step S201 of loading the wafer 100 into the container 202 of the substrate processing apparatus 200a will be described. Before the wafer 100 is loaded, the hole 224a is adjacent to the substrate loading/unloading port 205. Therefore, the hole 224a is arranged on the substrate mounting surface 211a. Further, in the present embodiment, an example of processing four wafers 100 in the container 202 will be described.

Details will be described below. The arm of the vacuum transfer robot 170 enters the process chamber 201 through the substrate loading/unloading port 205, and mounts the wafers 100 in the holes 224 (224a to 224d) of the rotary tray 222.

After mounting the wafers 100, the rotary tray 222 is lowered. At this time, the respective substrate mounting surfaces 211 are relatively raised to a position higher than the surface of the rotary tray 222. By this operation, the wafers 100 are mounted on the substrate mounting surfaces 211 (211a to 211d). After the wafers 100 are mounted on the substrate mounting surfaces 211 (211a to 211d), the gate valve 208 is closed to seal the inside of the container 202.

When the wafers 100 are mounted on the respective substrate mounting tables 212, electric power is supplied to the respective heaters 213 embedded inside the substrate mounting tables 212 to control the temperature of the surfaces of the wafers 100 to a predetermined temperature. The temperature of the wafers 100 is, for example, the room temperature or higher and 800 degrees C. or lower, preferably the room temperature or higher and 700 degrees C. or lower. At this time, the temperature of the heaters 213 is adjusted by extracting a control value by the controller 280 based on the temperature information detected by temperature sensors (not shown) and controlling the state of power supply to the heaters 213 by a temperature control part (not shown).

(Selective Growth)

Thereafter, the following steps A and B are executed in sequence.

[Step A (Adsorption Inhibitor Supply Step)]

Figure 10A:
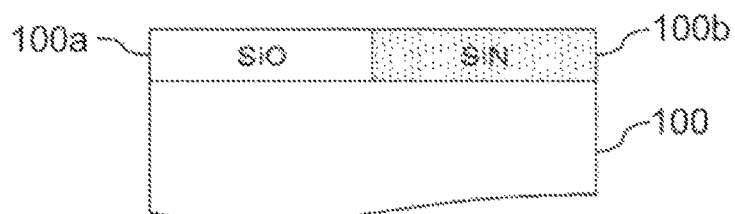
FIG. 10A is a partially enlarged sectional view showing the surface of a wafer 100 on which a base 100a containing a silicon oxide film as an example of one portion and a base 100b containing a silicon nitride film as an example of another portion are exposed.

In this step, a $ClF_3$ gas as an adsorption inhibitor is supplied to the wafer 100 in the process chamber 201, i.e., the wafer 100 from which the base 100a as an example of one part and the base 100b as an example of another part are exposed as shown in FIG. 10A.

Processing conditions in this step are exemplified as follows.

$ClF_3$ gas supply flow rate: 1 to 2000 sccm, preferably 1 to 500 sccm $ClF_3$ gas supply time: 1 second to 60 minutes $N_2$ gas supply flow rate (for each gas supply pipe): 0 to 10000 sccm Processing temperature: room temperature (25 degrees C.) to 300 degrees C., preferably room temperature to 200 degrees C.

Processing pressure: 1 to 2000 Pa, preferably 1 to 1000 Pa (e.g., less than atmospheric pressure)

The conditions described here are examples, and may be appropriately changed as necessary. The conditions described here are conditions under which the surface of the base 100a can be modified so as to be F-terminated as described below. In the present embodiment, the processing temperature is set to 100 degrees C. as a first temperature. The conditions described here are examples, and may be changed as necessary.

The notation of a numerical range such as "1 to 2000 Pa" in the subject specification means that the lower limit value and the upper limit value are included in the range. Therefore, for example, "1 to 2000 Pa" means "1 Pa or more and 2000 Pa or less". The same applies to other numerical ranges.

If the processing temperature in this step is less than the room temperature (25 degrees C.), the modification of the surface of the base 100a may be insufficient. By setting the processing temperature to a temperature equal to or higher than the room temperature, it is possible to sufficiently modify the surface of the base 100a. If the processing temperature exceeds 300 degrees C., at least one of the bases 100a and 100b, particularly the surface of the base 100b, may be etched and damaged by etching. By setting the processing temperature to a temperature of 300 degrees C. or lower, it is possible to suppress the etching of at least one of the bases 100a and 100b, particularly the surface of the base 100b, and to suppress the etching damage to the surface of the base 100b. By setting the processing temperature to 200 degrees C. or lower, this effect can be surely obtained.

Figure 12A:
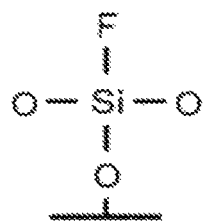
FIGS. 12A to 12D are partially enlarged sectional views showing the surface of the base 100a in the wafer subjected to a modifying process.
Figure 12B:
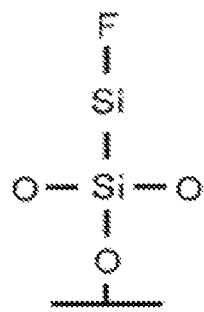
Figure 12C:
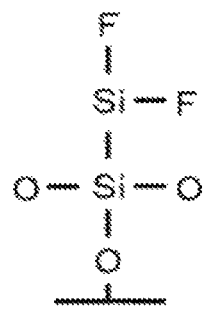
Figure 12D:
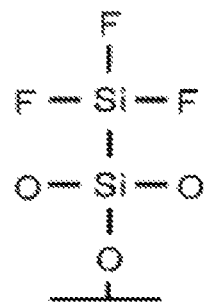

By supplying the $ClF_3$ gas to the wafer 100 under the above-mentioned conditions, F-containing radicals can be generated from the $ClF_3$ gas, and the surface of the base 100a can be caused to react with the F-containing radicals. Examples of the F-containing radicals include F, $ClF_2$, ClF and the like. In this step, the surface of the base 100a can be modified so as to be F-terminated without etching by the action of the F-containing radicals generated from the $ClF_3$ gas. The modified base 100a has an F-terminated surface. Specifically, the OH group (see FIG. 11) on the surface of the base 100a is replaced with an F-containing substance such as F or the like as illustrated in FIG. 12A, and the surface of the base 100a is F-terminated. Since the surface of the base 100a is F-terminated, a film formation reaction is less likely to proceed on the surface of the base 100a in step B described later. More precisely, it is possible to prolong the time until a film formation reaction occurs, i.e., the incubation time. The surface of the F-terminated base 100a is a surface that does not substantially contain an organic component.

Figure 10B:
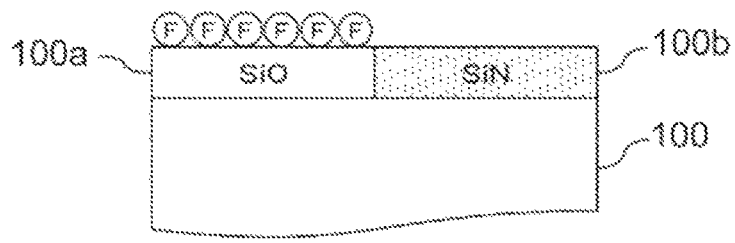
FIG. 10B is a partially enlarged sectional view showing the surface of the wafer 100 on which the surface of the base 100a is selectively modified by fluorine-containing radicals generated from a fluorine-containing gas.

As shown in FIG. 10B, in this step, it is possible to selectively (preferentially) modify the surface of the base 100a while suppressing the modification of the surface of the base 100b. At this time, a part of the surface of the base 100b may be modified, but the modification amount is smaller than the modification amount of the surface of the base 100a. Such selective (preferential) modification is made possible because many regions of the surface of the base 100b before starting step A are not OH-terminated, whereas the entire surface of the base 100a is OH-terminated. Since OH terminations are not formed in many regions on the surface of the base 100b, F terminations are not formed in the regions. However, as described above, an OH termination may be formed in a part of the surface of the base 100b and in that case, an F termination may be formed in the part of the region by the action of F-containing radicals. On the other hand, since OH terminations are formed over the entire surface of the base 100a, very stable F terminations are formed over the entire surface by the action of F-containing radicals.

After selectively modifying the surface of the base 100a among the bases 100a and 100b in this way, the supply of the $ClF_3$ gas into the process chamber 201 is stopped. Then, an $N_2$ gas is supplied into the process chamber 201, and the $ClF_3$ gas or the like remaining in the process chamber 201 is removed from the process chamber 201.

As the F-containing gas, in addition to the $ClF_3$ gas, it may be possible to use a fluorine ($F_2$) gas, a chlorine fluoride gas (ClF) gas, an $F_2$+nitrogen monoxide (NO) gas, a $ClF_3$+NO gas, a ClF+NO gas, a nitrogen trifluoride ($NF_3$) gas, a nitrosyl fluoride (FNO) gas, a tungsten hexafluoride ($WF_6$) gas, or a mixed gas thereof.

[Step B (Processing Gas Supply Step)]

In this step B, steps B1 and B2 are executed in sequence.

[Step B1]

In this step, $SiCl_4$ gas (precursor) is supplied to the wafer 100 in the process chamber 201, i.e., the wafer 100 after the surface of the base 100a is selectively modified among the bases 100a and 100b.

Processing conditions in this step are exemplified as follows.

$SiCl_4$ gas supply flow rate: 1 to 2000 sccm, preferably 10 to 1000 sccm $SiCl_4$ gas supply time: 1 to 180 seconds, preferably 1 to 120 seconds Processing temperature: 350 to 600 degrees C., preferably 400 to 550 degrees C.

Processing pressure: 1 to 2000 Pa, preferably 10 to 1333 Pa

Other processing conditions are the same as the processing conditions in step A. In the present embodiment, the processing temperature is set to 400 degrees C. as a second temperature. The conditions described here are examples, and may be appropriately changed as necessary.

By supplying the $SiCl_4$ gas to the wafer 100 under the above conditions, a Si-containing layer containing Cl is formed on the surface of the base 100b including an unmodified region among the bases 100a and 100b. That is, the Si-containing layer containing Cl is formed starting from the unmodified region of the base 100b, i.e., the region where an adsorption site is maintained. The Si-containing layer containing Cl is formed by chemical adsorption or physical adsorption of $SiC_4$ on the surface of the base 100b, chemical adsorption of a substance ($SiCl_x$) generated by decomposition of a part of $SiCl_4$, and deposition of Si by thermal decomposition of $SiCl_4$. The Si-containing layer containing Cl may be an adsorption layer of $SiC_4$ or $SiCl_x$ (physical adsorption layer or chemical adsorption layer), or may be a deposition layer of Si containing Cl. In the subject specification, the Si-containing layer containing Cl is also simply referred to as Si-containing layer.

In this step, it is possible to selectively form the Si-containing layer on the surface of the base 100b while suppressing the formation of the Si-containing layer on the surface of the base 100a. The reason why such a selective formation of Si-containing layer is possible is that the F termination existing on the surface of the base 100a acts as a factor that inhibits the formation of the Si-containing layer (the adsorption of Si) on the surface of the base 100a, i.e., an inhibitor.

After the Si-containing layer is formed on the surface of the base 100b, the supply of the $SiCl_4$ gas into the process chamber 201 is stopped. Then, the gas or the like remaining in the process chamber 201 is removed from the process chamber 201 by the same processing procedure as in the purging in step A (vacuum/purging).

As the precursor gas (film-forming gas), in addition to the $SiCl_4$ gas, it may be possible to use a chlorosilane-based gas such as a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a hexachlorodisilane ($Si_2Cl_6$, abbreviation: HCDS) gas, an octachlorotrisilane ($Si_3Cl_8$, abbreviation: OCTS) gas or the like, a bromosilane-based gas such as tetrabromosilane ($SiBr_4$) gas or the like, and an iodosilane-based gas such as a tetraiodosilane ($SiI_4$) gas or the like.

[Step B2]

In this step, an $NH_3$ gas (reactant) is supplied to the wafer 100 in the process chamber 201, i.e., the Si-containing layer formed on the base 100b.

Processing conditions in this step are exemplified as follows.

$NH_3$ gas supply flow rate: 10 to 10000 sccm $NH_3$ gas supply time: 1 to 60 seconds, preferably 5 to 50 seconds Processing pressure: 1 to 4000 Pa, preferably 1 to 1333 Pa Other processing conditions are the same as the processing conditions in step A. The conditions described here are examples, and may be appropriately changed as necessary.

By supplying the $NH_3$ gas to the wafer 100 under the above conditions, at least a part of the Si-containing layer formed on the surface of the base 100b is nitrided (modified). By modifying the Si-containing layer, a layer containing Si and N, i.e., a silicon nitride layer (SiN layer) is formed on the surface of the base 100b (see FIG. 10C). When forming the SiN layer, impurities, such as Cl and the like contained in the Si-containing layer, constitute a gaseous substance containing at least Cl in the process of modifying the Si-containing layer with the $NH_3$ gas, and are discharged from the inside of the process chamber 201. As a result, the SiN layer becomes a layer having fewer impurities such as Cl and the like than the Si-containing layer formed in step B1.

After the SiN layer is formed on the surface of the base 100b, the supply of the $NH_3$ gas into the process chamber 201 is stopped. Then, the gas or the like remaining in the process chamber 201 is removed from the process chamber 201 by the same processing procedure as in the purging in step A (purging).

As the reaction gas (film-forming gas), in addition to the $NH_3$ gas, it may be possible to use, for example, a hydrogen nitride-based gas such as a diazene ($N_2H_2$) gas, a hydrazine ($N_2H_4$) gas, an $N_3H_8$ gas or the like.

[Performed a Predetermined Number of Times]

Figure 10C:
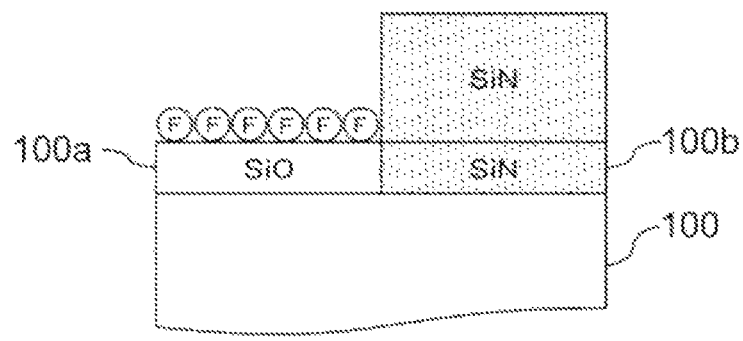
FIG. 10C is a partially enlarged sectional view showing the surface of the wafer 100 on which a silicon nitride film is selectively formed on the substrate of a base 100b.
Figure 10D:
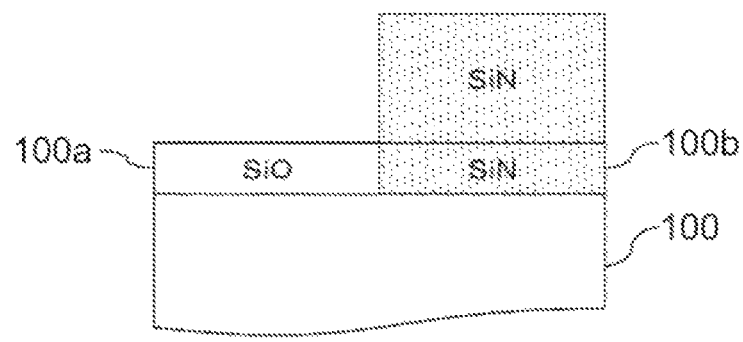
FIG. 10D is a partially enlarged sectional view showing the surface of the wafer 100 on which F terminations are eliminated by heating the wafer 100 shown in FIG. 10C to 600 degrees C.
Figure 11:
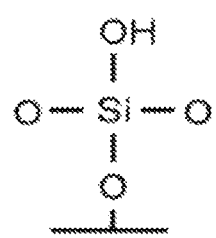
FIG. 11 is a partially enlarged sectional view showing the surface of the base 100a in the wafer not yet subjected to a modifying process.

By performing, a predetermined number of times (n times where n is an integer of 1 or more), a cycle of performing the above-described steps B1 and B2 non-simultaneously, i.e., without synchronization, as shown in FIG. 10C, a SiN film can be selectively grown and formed on the surface of the base 100b among the bases 100a and 100b exposed from the surface of the wafer 100.

The above cycle is preferably repeated a plurality of times. That is, it is preferable that the thickness of the SiN layer formed per cycle is set to be smaller than a desired film thickness, and the above-mentioned cycle is repeated a plurality of times until the film thickness of the film formed by stacking the SiN layers reaches the desired film thickness (cyclic processing).

By the way, as the wafer 100 continues to be heated when performing steps B1 and B2, the F terminations existing on the surface of the base 100a may be gradually desorbed (in other words, peeled) with the lapse of time. If the desorption of the F-terminations increases, the selectivity may decrease and an unnecessary SiN film may be formed on the surface of the base 100a.

Therefore, in the present embodiment, steps B1 and B2 are temporarily stopped to temporarily stop the growth of the SiN film while the F-terminations on the surface of the base 100a are desorbed by a predetermined amount and an unnecessary SiN film is not formed on the surface of the base 100a. That is, the predetermined number of times (n times where n is an integer of 1 or more) at which the cycle of performing the above-described steps B1 and B2 non-simultaneously, i.e., without synchronization, is performed, is preferably set to a value such that the processing gas is supplied until a predetermined amount of the first adsorption inhibitor (e.g., F-terminations) is desorbed.

(Adsorption Inhibitor Removal Step)

Then, after stopping steps B1 and B2, the wafer 100 is heated to a temperature higher than the second temperature (400 degrees C.) used at the time of film formation, for example, 600 degrees C. as a third temperature, thereby eliminating all the F-terminations on the surface of the base 100a. In other words, the surface of the base 100a is once returned to the base having no F-termination. This makes it possible to improve the selectivity of the subsequent film formation.

In this way, by merely heating the wafer 100 at a predetermined temperature, it is possible to easily and reliably remove the F-terminations on the surface in a short time.

As in the present embodiment, by temporarily stopping steps B1 and B2 to temporarily stop the growth of the SiN film while the F-terminations on the surface of the base 100a are desorbed by a predetermined amount and an unnecessary SiN film is not formed on the surface of the base 100a, it is possible to suppress film formation in a state in which the selectivity is lost. Further, by performing the cyclic processing while maintaining the F terminations, it is possible to form a high-quality SiN layer.

(Cooling Step)

After the final step B2 is completed, an $N_2$ gas is continuously supplied into the process chamber 201 to cool the wafer 100 in the process chamber 201.

When cooling the wafer 100, the rotary tray 222 is lowered, the wafer 100 is lifted from the substrate mount 210, and the lower surface of the wafer 100 is supported by the lift pins 207. Thereafter, the $N_2$ gas (having a lower temperature than the wafer 100) is supplied into the process chamber 201 to cool the wafer 100 lifted from the substrate mount 210.

Since the wafer 100 is cooled by being supported by the lift pins 207 and lifted from the substrate mount 210, it is possible to efficiently cool the wafer 100 in a short time as compared with the case where the wafer 100 is cooled while being mounted on the substrate mount 210. Further, since the wafer 100 is cooled by being supported by the lift pins 207 and lifted from the substrate mount 210, it is possible to cool the wafer 100 while maintaining the in-plane temperature uniformity, and to suppress deformation (warpage or the like) of the wafer 100.

Further, by making the pressure in the process chamber 201 higher than that at the time of forming the SiN film (e.g., about the atmospheric pressure having higher heat conduction than a negative pressure), it is possible to cool the wafer 100 in a short time. In other words, it is possible to shorten the cooling time of the wafer 100.

By supplying the $N_2$ gas (having a lower temperature than the wafer 100) into the process chamber 201 in this way, it is possible to cool a member in the process chamber 201 (e.g., the surface of the shower head 230, the wall surface of the process chamber 201, etc.). Incidentally, when the surface temperature of the shower head 230 is high, it may affect the reaction characteristics of the adsorption inhibitor (e.g., the $ClF_3$ gas) and the processing gas.

The temperature of the wafer 100 can be measured by a temperature sensor (not shown) connected to the controller 280, and the supply and stop of the $N_2$ gas for cooling is performed by the controller 280 according to the measured temperature of the wafer 100.

The cooled wafer 100 is then taken out from the substrate processing apparatus 200a, and is subjected to steps A and B in the adjacent substrate processing apparatus 200b in the same manner as in the substrate processing apparatus 200a described above. Therefore, it is preferable that the wafer 100 is cooled to a predetermined temperature suitable for performing step A in the substrate processing apparatus 200b, i.e., about 100 degrees C. in the present embodiment. The temperature of about 100 degrees C. is, for example, 100±10 degrees C.

After the wafer 100 is cooled to a predetermined temperature in this way, the cooled wafer 100 is transferred to the adjacent substrate processing apparatus 200b by the hand of the vacuum transfer robot 170. Since the substrate processing apparatus 200b performs steps A and B in the same manner as in the substrate processing apparatus 200a described above, the temperature of the substrate mount 210 before loading the wafer 100 is set to 100 degrees C. in advance.

The temperature of the wafer 100 loaded into the substrate processing apparatus 200b is equal to or close to the temperature of the substrate mount 210 for mounting the wafer 100. Therefore, when the wafer 100 is mounted on the substrate mount 210, no large temperature difference is generated between the front surface (upper surface) and the back surface (lower surface in contact with the substrate mount 210) of the wafer 100. Therefore, it is possible to suppress the generation of internal stress due to the temperature difference in the wafer 100 mounted on the substrate mount 210, and to suppress the deformation (warpage or the like) due to the internal stress.

If the wafer 100 is deformed on the substrate mount 210, the wafer 100 mounted on the substrate mount 210 may be displaced in the process of deformation. However, by setting the temperature of the wafer 100 to be equal to or close to the temperature of the substrate mount 210, it is possible to suppress deformation of the wafer 100. This makes it possible to suppress displacement of the wafer 100 on the substrate mount 210. Since the wafer 100 mounted on the substrate mount 210 is not displaced in the middle of the process, for example, when the wafer 100 is taken out from the substrate processing apparatus 200b, the wafer 100 can be properly and surely gripped by the hand of the vacuum transfer robot 170.

Since the wafer 100 loaded into the substrate processing apparatus 200b is subjected to the same processing as in the substrate processing apparatus 200a, the thickness of the silicon nitride layer (SiN layer) can be further increased while maintaining the selectivity. As used herein, the term "same processing" means each step of the above-described substrate processing process.

In the substrate processing system 10 of the present embodiment, the same processing as in the substrate processing apparatus 200a is sequentially performed by the substrate processing apparatuses 200b to 200d, whereby the thickness of the silicon nitride layer (SiN layer) can be increased to a predetermined thickness while maintaining the selectivity.

By processing the wafer 100 through the use of the substrate processing system 10 of the present embodiment in this way, a desired film can be selectively grown to obtain a high-quality semiconductor device.

OTHER EMBODIMENTS

Although one embodiment of the present disclosure has been described above, the present disclosure is not limited to the above-described embodiment. It goes without saying that the present disclosure can be variously modified and implemented without departing from the spirit thereof.

In the substrate processing system 10 of the present embodiment, four substrate processing apparatuses 200 are provided. However, the number of substrate processing apparatuses 200 may be increased or decreased as needed.

In the above-described embodiment, the wafer 100 is cooled in the final step of the substrate processing apparatus 200a, and then the cooled wafer 100 is transferred to the substrate processing apparatus 200b. However, the wafer 100 may not be cooled in the substrate processing apparatus 200a, but may be cooled during the transfer of the wafer 100 from the substrate processing apparatus 200a to the substrate processing apparatus 200b (e.g., inside the vacuum transfer chamber 140).

In the above-described embodiment, the adsorption inhibitor of the substrate processing apparatus 200a and the adsorption inhibitor of the substrate processing apparatus 200b are the same gas ($ClF_3$ gas). Alternatively, a first adsorption inhibitor may be used in the substrate processing apparatus 200a, and a second adsorption inhibitor different from the first adsorption inhibitor may be used in the substrate processing apparatus 200b.

In this case, the processing with the second adsorption inhibitor can be performed in a state of being heated at a fourth temperature. The fourth temperature may be the same as or different from the first temperature used when processing the wafer with the first adsorption inhibitor. The fourth temperature may be a temperature higher than the first temperature or a temperature lower than the first temperature. By setting the fourth temperature to a temperature suitable for the second adsorption inhibitor, the adsorption property of the second adsorption inhibitor can be improved after the first adsorption inhibitor is desorbed.

By setting the fourth temperature to a temperature lower than the first temperature, it is possible to promote the adsorption of the adsorption inhibitor to a partially film-formed portion, thereby improving the selectivity. Further, by setting the fourth temperature to a temperature higher than the first temperature, it is possible to shorten the time for cooling from the temperature of the first adsorption inhibitor (e.g., 600 degrees C.). In addition, by setting the fourth temperature to the same temperature as the first temperature, the previous processing can be performed continuously.

By performing the processing under different conditions through the use of the first adsorption inhibitor and the second adsorption inhibitor as described above, it is possible to improve the selectivity of selective film formation. Further, it is possible to shorten the temperature adjustment time of each of the first temperature, the second temperature and the third temperature, thereby improving the semiconductor manufacturing throughput.

In the above-described embodiment, four substrate mounting tables 212 are provided in one container 202. However, the number of substrate mounting tables 212 provided in one container 202 is not limited to four, and may be one to three, or five or more.

Figure 13:
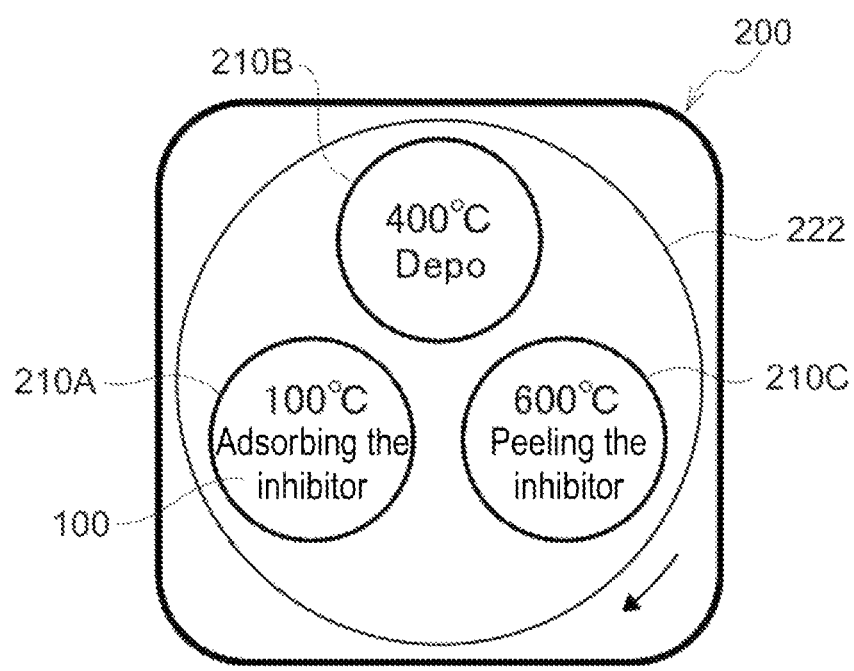
FIG. 13 is a plan view showing a container of a substrate processing apparatus according to another embodiment of the present disclosure.

In the above-described embodiment, there has been described the example in which four wafers 100 are simultaneously subjected to the same processing in one substrate processing apparatus 200. For example, as shown in FIG. 13, a substrate processing mounting part 210A for causing an adsorption inhibitor to be adsorbed, a substrate processing mounting part 210B for performing film formation, and a substrate processing mounting part 210C for desorbing (peeling) the adsorption inhibitor may be installed inside of the substrate processing apparatus 200, and the rotary tray 222 may be rotated to move the wafer 100 to the respective substrate processing mounting parts 210A to 210C to perform each processing.

As a result, the wafer 100 does not have to be sequentially transferred to the plurality of substrate processing apparatuses 200, and each processing can be performed in one substrate processing apparatus. Therefore, it is possible to shorten the transfer time of the wafer 100.

Since the processing temperatures in the adsorption process of the adsorption inhibitor, the film-forming process and the desorption process of the adsorption inhibitor are different, it is preferable to provide a partition wall (heat shield plate) or the like between the substrate processing mounting parts so as not to affect other adjacent processes.

Although the example in which the gas containing a halogen element (e.g., fluorine (F)) is used as the adsorption inhibitor has been described, the technique of the present disclosure is not limited thereto. As the adsorption inhibitor, a material containing an organic substance (hydrocarbon (CH—) ligand) may be used. Examples of the organic adsorption inhibitor include HMD SN (hexamethyldisilazane).

In the method of manufacturing a semiconductor device according to the present embodiment, there has been illustrated the example in which the SiN layer is grown on the surface of the wafer 100. The method of manufacturing a semiconductor device according to the present embodiment can also be applied to a case where the type of gas is changed and a film other than the SiN layer is grown on the surface of the wafer 100.

According to the present disclosure in some embodiments, it is possible to maintain selectivity in a semiconductor device manufacturing process.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
   (a) adsorbing a first adsorption inhibitor to a first portion of a substrate in a first process chamber by heating the substrate to a first temperature and supplying the first adsorption inhibitor;
   (b) after (a), forming a film on a second portion of the substrate, where the first adsorption inhibitor is not adsorbed, by heating the substrate to a second temperature higher than the first temperature and supplying a processing gas;
   (c) after (b), removing the first adsorption inhibitor adsorbed to the substrate by heating the substrate to a third temperature higher than the second temperature;
   (d) after (c), heating the substrate to a fourth temperature and supplying a second adsorption inhibitor;
   (e) after (d), heating the substrate to the second temperature higher than the fourth temperature and supplying the processing gas; and (f) after (e), removing the second adsorption inhibitor adsorbed to the substrate by heating the substrate to the third temperature higher than the second temperature.

2. The method of claim 1, wherein in (b), the film is formed on the substrate by supplying, as the processing gas, a first gas and a second gas alternately a predetermined number of times to the substrate.

3. The method of claim 2, wherein in (b), the predetermined number of times is set to a value such that the processing gas is supplied until a predetermined amount of the first adsorption inhibitor adsorbed to the substrate is desorbed.

4. The method of claim 1, wherein the fourth temperature is a temperature different from the first temperature.

5. The method of claim 1, wherein the fourth temperature is a temperature lower than the first temperature.

6. The method of claim 1, wherein the fourth temperature is a temperature higher than the first temperature.

7. The method of claim 1, wherein the fourth temperature is a temperature equal to the first temperature.

8. The method of claim 5, further comprising:
(g) between (c) and (d), cooling the substrate from the third temperature to the fourth temperature.

9. The method of claim 8, wherein in (g), an inert gas is supplied to the substrate.

10. The method of claim 8, wherein (g) is performed in a state in which the substrate in the first process chamber is spaced apart from a substrate mounting table for mounting the substrate thereon.

11. The method of claim 8, wherein in (g), the substrate is cooled by mounting the substrate on a substrate mounting table adjusted to be in a range from a temperature lower than the first temperature by 10 degrees C. to a temperature higher than the first temperature by 10 degrees C.

12. The method of claim 1, wherein after (f), one or both of a set of (a), (b) and (c) and a set of (d), (e) and (f) are performed a predetermined number of times.

13. The method of claim 1, wherein (d), (e) and (f) are performed in a second process chamber, and
wherein the method further comprises cooling a member installed in the first process chamber while (d), (e) and (f) are performed.

14. The method of claim 1, wherein (a) is performed in a state in which the substrate is mounted on a first substrate mounting table installed in the first process chamber,
wherein (b) is performed in a state in which the substrate is mounted on a second substrate mounting table installed in the first process chamber, and
wherein (c) is performed in a state in which the substrate is mounted on a third substrate mounting table installed in the first process chamber.

15. The method of claim 14, further comprising:
(h) between (c) and (d), mounting the substrate on the first substrate mounting table;
(i) between (d) and (e), mounting the substrate on the second substrate mounting table; and
(j) between (e) and (f), mounting the substrate on the third substrate mounting table.

16. A substrate processing apparatus, comprising:
a process chamber configured to process a substrate;
a heater configured to heat the substrate loaded into the process chamber;
an adsorption inhibitor supplier configured to supply an adsorption inhibitor to the substrate loaded into the process chamber;
a processing gas supplier configured to supply a processing gas to the substrate loaded into the process chamber; and
a controller configured to be capable of controlling the heater, the adsorption inhibitor supplier, and the processing gas supplier,
wherein the controller is configured to control the heater, the adsorption inhibitor supplier, and the processing gas supplier to perform formation of a film on the substrate a plurality of times by repeating a plurality of times:
(a) adsorbing a first adsorption inhibitor to a first portion of the substrate in a first process chamber by heating the substrate to a first temperature and supplying the first adsorption inhibitor;
(b) after (a), forming the film on a second portion of the substrate, where the first adsorption inhibitor is not adsorbed, by heating the substrate to a second temperature higher than the first temperature and supplying the processing gas;
(c) after (b), removing the first adsorption inhibitor adsorbed to the substrate by heating the substrate to a third temperature higher than the second temperature;
(d) after (c), heating the substrate to a fourth temperature and supplying a second adsorption inhibitor;
(e) after (d), heating the substrate to the second temperature higher than the fourth temperature and supplying the processing gas; and
(f) after (e), removing the second adsorption inhibitor adsorbed to the substrate by heating the substrate to the third temperature higher than the second temperature.

17. A non-transitory computer-readable recording medium storing a program that causes, by a computer, a substrate processing apparatus to perform a process comprising:
(a) adsorbing a first adsorption inhibitor to a first portion of a substrate in a first process chamber by heating the substrate to a first temperature and supplying the first adsorption inhibitor;
(b) after (a), forming a film on a second portion of the substrate, where the first adsorption inhibitor is not adsorbed, by heating the substrate to a second temperature higher than the first temperature and supplying a processing gas;
(c) after (b), removing the first adsorption inhibitor adsorbed to the substrate by heating the substrate to a third temperature higher than the second temperature;
(d) after (c), heating the substrate to a fourth temperature and supplying a second adsorption inhibitor;
(e) after (d), heating the substrate to the second temperature higher than the fourth temperature and supplying the processing gas; and
(f) after (e), removing the second adsorption inhibitor adsorbed to the substrate by heating the substrate to the third temperature higher than the second temperature.

\* \* \* \* \*